United States Patent
Razavi et al.

(10) Patent No.: US 7,528,357 B2
(45) Date of Patent: May 5, 2009

(54) PULSE DETECTOR WHICH EMPLOYS A SELF-RESETTING PULSE AMPLIFIER

(75) Inventors: Behzad Razavi, Los Angeles, CA (US); Lawrence C. West, San Jose, CA (US); Bryan D. Ackland, Old Bridge, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 11/407,376

(22) Filed: Apr. 19, 2006

(65) Prior Publication Data
US 2006/0273244 A1 Dec. 7, 2006

Related U.S. Application Data

(60) Provisional application No. 60/673,706, filed on Apr. 21, 2005.

(51) Int. Cl.
*H03G 3/20* (2006.01)
(52) U.S. Cl. .................... 250/214 A; 250/214 AG; 250/214 R
(58) Field of Classification Search ............. 250/214 A, 250/214 AG, 214, 214 SW, 214 SF, 214 DC, 250/214 R; 327/514; 398/209
See application file for complete search history.

(56) References Cited

U.S. PATENT DOCUMENTS

| | | | | |
|---|---|---|---|---|
| 5,155,353 A * | 10/1992 | Pahr | | 250/214 R |
| 5,367,154 A * | 11/1994 | Pfeiffer | | 250/208.1 |
| 5,699,003 A * | 12/1997 | Saeki | | 327/261 |
| 5,982,426 A * | 11/1999 | Kimura | | 348/241 |
| 6,122,220 A * | 9/2000 | Kim et al. | | 365/233 |
| 6,215,334 B1 * | 4/2001 | Pernyeszi | | 327/73 |
| 6,590,687 B1 * | 7/2003 | Olsen | | 398/189 |
| 6,961,523 B2 * | 11/2005 | Furuyama | | 398/154 |
| 2002/0176067 A1* | 11/2002 | Charbon | | 356/4.01 |
| 2006/0108511 A1* | 5/2006 | Cok et al. | | 250/214 R |

OTHER PUBLICATIONS

Razavi, Chapter 11 Bandgap References, Design of Analog CMOS Integrated Circuits, International Edition, pp. 377-404, 2001.

* cited by examiner

Primary Examiner—Thanh X Luu
Assistant Examiner—Kevin Wyatt
(74) Attorney, Agent, or Firm—Eric L. Prahl

(57) ABSTRACT

A circuit including: an optical detector for detecting an optical pulse and generating therefrom a current pulse on an output; a pulse detector circuit having an input electrically connected to the optical detector and having an output for outputting a detection pulse in response to detecting the current pulse on its input, said pulse detector circuit including: a resettable amplifier including an input for receiving the current pulse from the optical detector, a reset terminal for resetting the amplifier after the amplifier detects the current pulse on its input, and an output for outputting a signal from which the detection pulse is derived; and a reset delay chain feeding back to the reset terminal of the resettable amplifier a feedback signal derived from the output signal of the resettable amplifier.

24 Claims, 4 Drawing Sheets

PULSE DETECTOR WHICH EMPLOYS A SELF-RESETTING PULSE AMPLIFIER

This application claims the benefit of U.S. Provisional Application No. 60/673,706, filed Apr. 21, 2005, which is incorporated herein by reference.

TECHNICAL FIELD

This invention generally relates to detecting electrical pulses and more specifically it relates to detecting electrical pulses from an optical detector.

BACKGROUND OF THE INVENTION

An optical detector generates a small, current pulse in response to an incident optical pulse. The optical pulse may be very brief, for example, a few tens of picoseconds. There is often a large parasitic capacitance associated with the detector. This capacitance prevents the current pulse from generating a voltage large enough to trigger digital circuitry. Some sort of amplifier or pulse detector is needed to convert the optical pulse into a voltage pulse large enough to trigger digital circuitry.

In some applications, the pulse detector is used to receive optical clock pulses and convert these into electrical clock pulses for clocking digital electronic circuitry. In such applications, the timing of the edge is most important. The delay that occurs between the optical pulse and the electrical clock pulse should be as independent as possible from variations in transistor process parameters, temperature, and supply voltage as any variation contributes to skew error in the generated clock pulse. It is particularly important that the delay of the pulse detector be independent of dynamic variations in supply voltage, so as to avoid jitter in the timing of the clock edge. Both skew and jitter can cause a reduction in the maximum operating frequency of the digital circuit clocked by the pulse detector.

The common way to amplify the small signal generated by an optical detector in a high-speed circuit is with a transimpedance amplifier. These are used to amplify the small current pulses in a linear response, which means that the output pulse shape is similar to the input pulse, but with magnified voltage or current. Light incident on a detector is usually limited to low power by the cost of the laser to provide this light, or by attenuation of the light through the transmission medium such as optical fibers, waveguides, or couplers, or both. The photo-current generated by light on the detector, coupled with the capacitance of the detector and other connected circuits is usually not sufficient to swing the voltage far enough to drive logic circuitry, approximately 1 V in current CMOS technology. Thus, the signal usually requires amplification to generate for useful signal levels in logical systems.

The silicon technology that is used to fabricate the nanometer devices employed in such an amplifier is typically not fast enough to follow the small pulses generated by the detector. In short, one cannot build silicon-based devices or transimpedance circuits that are fast enough to follow less than a few picosecond pulse of light or electrical current.

SUMMARY OF THE INVENTION

As disclosed herein, it is not necessary to linearly amplify the optical pulse as discussed above. What is needed is a circuit that can respond to the small current pulse generated by the optical detector and generate an output voltage pulse large enough to trigger digital circuitry with a delay from optical pulse to output pulse that is relatively independent of process, supply and temperature variations.

In general, in one aspect, the invention features a circuit including: an optical detector for detecting an optical pulse and generating therefrom a current pulse on an output; a pulse detector circuit having an input electrically connected to the optical detector and having an output for outputting a detection pulse in response to detecting the current pulse on its input, said pulse detector circuit including: a resettable amplifier including an input for receiving the current pulse from the optical detector, a reset terminal for resetting the amplifier after the amplifier detects the current pulse on its input, and an output for outputting a signal from which the detection pulse is derived; and a reset delay chain feeding back to the reset terminal of the resettable amplifier a feedback signal derived from the output signal of the resettable amplifier.

Other embodiments include one or more of the following features. The circuit also includes an optical waveguide in which the optical detector is arranged to detect the optical pulse as it travels through the optical waveguide. The pulse detector further includes a biasing circuit and the resettable amplifier includes a current load that is biased by the biasing circuit. The biasing circuit is a supply-independent biasing circuit. The pulse detector circuit further includes an output stage which has an input for receiving the output signal of the resettable amplifier and an output for outputting the detection pulse. The output stage includes an output inverter. The output inverter has an input which is the input of the output stage and has an output which is the output of the output stage. The reset delay chain is connected between the output of the output stage and the reset terminal. The current load is a MOSFET. The resettable amplifier includes a MOSFET configured as a common-source stage. The biasing circuit includes a current mirror. The biasing circuit is a resistorless biasing circuit. The biasing circuit includes a first and second transistor configured as a first current mirror and a third and fourth transistor configured as a second current mirror. The first, second, third and fourth transistors are MOSFETs. The first and second MOSFETs have channel lengths that are equal and wherein the third and fourth MOSFETs have channel lengths that are unequal. The current load is a MOSFET and the first and second MOSFETs and the current load MOSFET have their gate terminals electrically connected together. The reset delay chain is a plurality of inverters connected in series. The reset delay chain is made up of an odd number of inverters connected in series. The optical detector is directly connected to the input of the resettable amplifier.

In general, in another aspect, the invention features a method of detecting an optical pulse traveling through an optical waveguide. The method involves: converting the optical pulse traveling through the optical waveguide to a current pulse; detecting the current pulse; upon detecting the current pulse, causing an output signal to transition from a first voltage level to a second voltage level; after waiting a predetermined period of time following the transition from the first voltage level to the second voltage level, causing the output signal to transition back to the first voltage level.

Some of the embodiments described herein represent a novel approach to detecting optical pulses that carry timing or clock signal information. Since the optical signals in those embodiments are not sending data but only timing information, the detector circuit only needs to detect when the pulse occurs rather than what the shape of the pulse is. Because the detector circuit need not read or extract data from the pulse and thus preserving the shape of the pulse becomes less important, it is becomes possible to use the techniques described herein to derive the required electrical timing or clock signals from the detected optical pulse.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
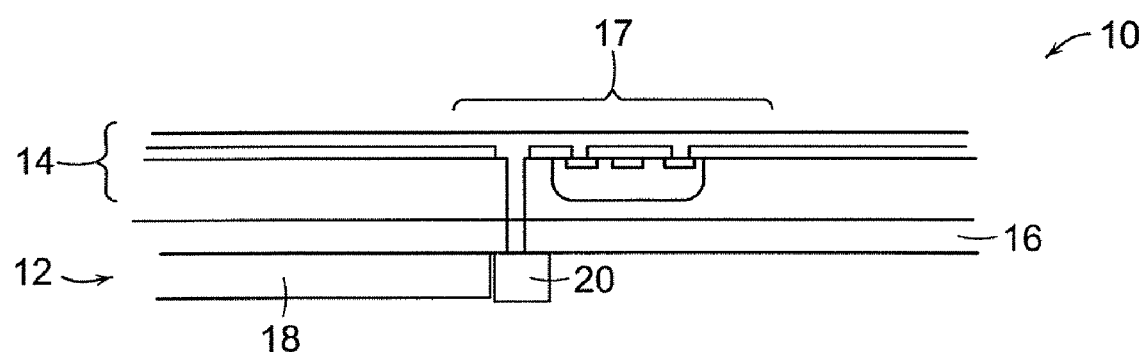
FIG. 1 shows a diagrammatic representation of a optical ready substrate in which a self-resetting amplifier is used for pulse detection.

FIG. 1 shows a portion of a circuit that is used to distribute optical timing or clock signals to electrical circuitry in a silicon chip. The particular embodiment shown here employs an optical ready substrate 10 of the type described in U.S. patent application Ser. No. 10/280,492, entitled "Optical Ready Wafers," and U.S. Ser. No. 10/280,505, entitled "Optical Ready Substrates," both of which are incorporated herein by reference. In this particular optical ready substrate, optical circuitry 12 is fabricated in a buried region within substrate and electronic micro-circuitry 14 is fabricated in an upper layer of the substrate. An insulating layer 16 separates the optical circuitry from the upper layer in which the microelectronic circuitry 17 is fabricated. The optical circuitry includes an optical waveguide 18 in which there is an optical detector 20 that detects the optical pulses that are distributed by waveguide 18 and converts them into electrical signals which are passed up to micro-electronic circuitry 17 fabricated in the upper layer of the substrate. In the described embodiment, optical detector 20 is an impurity-based detector of the type described in U.S. patent application Ser. No. 10/856,127, entitled "Impurity-Based Waveguide Detector System," also incorporated herein by reference. Micro-electronic circuitry 17 includes a self-resetting pulse amplifier which is described in greater detail below. In general, the self-resetting pulse amplifier detects the electrical pulses generated by optical detector and provides the corresponding timing or clock information to other micro-electronic circuitry that is fabricated on the chip.

An important realization is that the detector circuit that is used in timing signal distribution circuitry need not reproduce the shape of the received optical pulse as is often required in communications circuitry where the shape of the pulse carries data. In optical circuitry for distributing timing signals (e.g. clock signals, sampling signals, or other timing signals), it is the timing of the pulse that is relevant and not especially the shape of the pulse. So, rather than amplifying the received pulse and attempting to accurately reproduce its shape, the self-resetting pulse amplifier of the described embodiment is designed to detect when the pulse occurs and to do so in a consistent and repeatable manner.

The amplifier described herein serves to amplify and shape narrow pulses (e.g. <20-ps) generated by a photodetector that is driven by a laser source. In essence, it detects the charge packet generated by the optical detector. The circuit integrates the charge delivered by the detector to produce a voltage change on the input and this change in turn triggers the circuit to change state or switch to another voltage. A reset loop then pulls the output voltage back to its stable value after a predetermined period and before a next pulse is expected to arrive. In this regard, the pulse detector circuit acts like a monostable circuit. Various analog techniques are used to reduce sensitivity to supply noise and process and temperature variations while allowing operation at 2 GHz and above.

Figure 2:
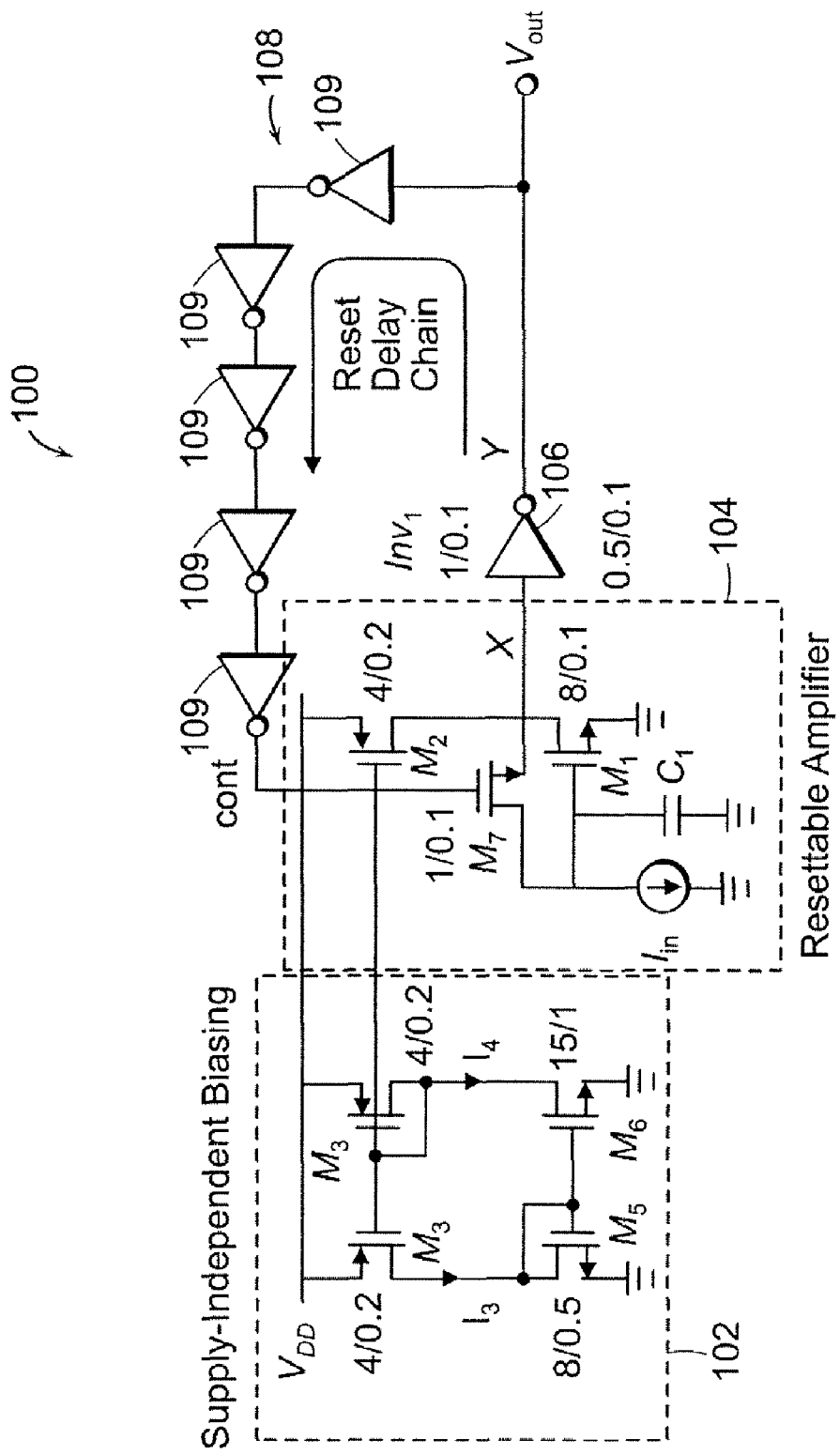
FIG. 2 is a circuit diagram of one embodiment of the self-resetting amplifier used for pulse detection.

Referring to FIG. 2, circuit 100 includes four blocks, namely, a supply-independent bias source 102, a resettable amplifier stage 104, an output inverter stage 106, and a reset delay chain 108 that provides negative feedback around amplifier 104.

Resettable amplifier 104 includes three MOSFETs, namely, $M_1$, $M_2$, and $M_7$. $M_1$ is configured as a common source amplifier with the drain of $M_2$ connected to the drain of $M_1$. The gate of $M_1$ is connected to the optical detector which supplies a charge packet represented by a current source $I_{in}$. The total capacitance at the gate of $M_1$ is $C_1$, the total effective capacitance that must be charged by the optical detector to produce a $\Delta V$ at the gate of $M_1$. $C_1$ is accounted for primarily by the output capacitance of the optical detector and the input capacitance of $M_1$. The load transistor, $M_2$, has its source connected to the voltage supply $V_{DD}$ and biasing circuit 102 provides to the gate of $M_2$ a fixed voltage relative to the $V_{DD}$ supply voltage. Biasing circuit 102 biases $M_2$ into saturation so it functions as a current source load.

The output of resettable amplifier, designated in FIG. 2 as point X, drives the input of output inverter amplifier 106. Output inverter 106 produces an output voltage at point Y that represents the output $V_{out}$ of the circuit.

$M_7$, which functions as a switch is connected between the drain and gate of $M_1$, with its gate driven by a signal that is feedback from the output through reset delay chain 108. In this case, reset delay chain includes five inverters 109 connected in series.

Biasing circuit 102 is a supply-independent bias circuit that biases $M_2$ so that it produces a fixed current that is insensitive to small fluctuations in supply voltage $V_{DD}$. Biasing circuit 102 includes two current mirrors, an upper current mirror including transistors $M_3$ and $M_4$, with the gate and drain terminals of $M_4$ connected together, and a lower current mirror including transistors $M_5$ and $M_6$, with the gate and drain terminals of $M_5$ connected together. $M_3$ and $M_4$ are the same size with equal channel lengths so the current densities within the devices for any given gate to source bias voltage are equal. Because of the arrangement of $M_3$ and $M_4$, the current through $M_4$ is reproduced in $M_3$, i.e., its current mirrors that of $M_4$. $M_5$ and $M_6$ are sized so that the current densities produced within the two devices when their gates are biased at the same voltage are different. In the described embodiment, the length of the channel of $M_6$ is designed to be twice that of $M_5$ and the width/length ratios of $M_6$ and $M_5$ are 15/1 and 8/0.5, respectively.

The sizes of $M_3$ and $M_4$ force $I_3$ to be equal to $I_4$ over range of gate-to-source voltages. In the case of $M_5$ and $M_6$, because they have different channel lengths, when they driven by equal gate-to-source voltages, their two currents will be equal at one non-zero operating point. Thus, the circuit has a single stable operating with the current equal to fixed non-zero value, $I_{ref}$. It should be noted that by using MOSFET transistors in one current mirror that have different channel lengths, the biasing circuit can be constructed without requiring a resistor in the source of $M_6$, as is typically done.

Transistor $M_2$ is designed to have the same physical dimensions as $M_4$ and $M_5$. As a consequence, when the gate voltage of $M_3$ and $M_4$ is applied to the gate of $M_2$, the output current of $M_2$ also becomes equal to $I_{ref}$. The output of this circuit sets the current of the current source within the amplifier stage and that current source functions as a load that is connected to the drain of $M_1$.

Figure 3:
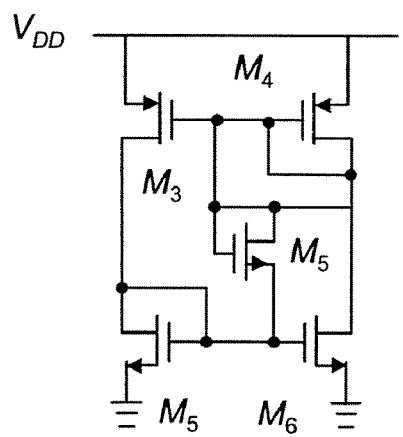
FIG. 3 shows the biasing source with a startup device to force the current to a non-zero state.

As implied above, the biasing circuit of the present embodiment actually has two stable operating points, one with $I_{ref}=0$ (also referred to as a degenerate bias point) and another with $I_{ref}$ equal to a non-zero value. To prevent the biasing circuit from getting stuck in the first operating point with $I_{ref}=0$, there also needs to be a startup circuit drives the biasing circuit out of the degenerate bias point and into the desired bias point. An example of a startup circuit is shown in FIG. 3. It simply includes a transistor $M_S$ configured as a diode which serves to create a current path from $V_{DD}$ to ground through $M_4$ and $M_5$, thereby turning them both on.

The operation of the circuit can be appreciated by assuming that initially the voltage at point X is high, e.g. near $V_{DD}$. Since there is an even number of inverters in the circuit connecting the voltage at point X to the gate of $M_7$ (i.e., six inverters), the voltage that is feedback to the gate of $M_7$ will also be high. This will turn on $M_7$ electrically connecting the drain of $M_1$ to the gate of $M_1$. As a result of $M_7$ being on, part of the current from $M_2$ will flow through $M_7$ into capacitance $C_1$ charging it and increasing the voltage at the gate of $M_1$. As the voltage at the gate of $M_1$ increases, $M_1$ will also turn on and its current will increase causing the voltage at its drain (i.e., point X) to fall. Eventually, the current through $M_1$ will exactly equal the load current being supplied by $M_2$ (i.e., $I_{ref}$) and $M_7$ will turn off. In other words, upon reset, $M_7$ tends to equalize the voltages at the gate and drain of $M_1$, charging the capacitance of the detector, $C_1$, to the bias voltage required to maintain amplifier 104 in its high-gain region. The decrease in voltage at point X will propagate through output inverter 106 and back through reset delay chain 108 to the reset gate of $M_7$ causing it to turn off. At this point the circuit will have established a stable operating point with the voltage at X being closer to ground and all of the current from $M_2$ passing through $M_1$.

After the reset is released, the charge provided by the detector (modeled by $I_{in}$) effects a change in the voltage across $C_1$. This change, which is a fall in voltage at the gate of $M_1$, is then amplified by both $M_1$ and the following output inverter 106, thereby producing a rail-to-rail voltage swing at node Y (i.e., a swing from $V_{DD}$ to ground).

As previously described that drop in voltage at Y will propagate back though reset delay chain 108 and cause the amplifier to be reset to its stable operating point. The length of the delay is determined by the length of the reset delay chain 108, i.e., the number of inverters in the chain. Each inverter introduces a predetermined increment of delay. In this case, the result is delayed by another five inverters so as to provide a reasonable duty cycle at 2 GHz.

A critical aspect of this design relates to the variation with process and temperature of the skew from the input pulse to the output generated at node Y. It is desirable to confine the delay of the first amplifying stage as it dominates this skew. This is accomplished by careful distribution of the required gain between $M_1$ and output inverter 106. The devices that make up output inverter 106 are sized so that it has a low threshold voltage. Thus, its output voltage will toggle as soon as its input voltage rises by a small amount.

Too much gain in $M_1$ causes a larger delay in the first stage, which is undesirable. To reduce the delay the gain from the gate of $M_1$ to point Y is distributed between the two stages, namely, the source-follower stage including $M_1$ and the output inverter. With the resettable amplifier designed to have low gain to keep delay within more acceptable range, the resettable amplifier will not produce a very large voltage swing, not large enough to achieve rail-to-rail operation. So, the gain of the output inverter is set to achieve the swings that are desired. In the described embodiment, the gain of the first stage is about 2-3 and the gain of the inverter is set to achieve a rail-to-rail voltage swing from the 100 mv change that is seen at the gate of $M_1$. Thus, the gain of the inverter is about 3-4.

Another important consideration stems from the variation of the skew with the supply voltage, i.e., the conversion of supply noise to jitter. To alleviate this effect, the current source used in the first stage is biased by means of a supply-independent core, $M_3$-$M_6$. If channel-length modulation of the transistors is neglected, this circuit produces a current that depends on the transistor parameters but not the supply voltage.

Simulation Results

Figure 4:
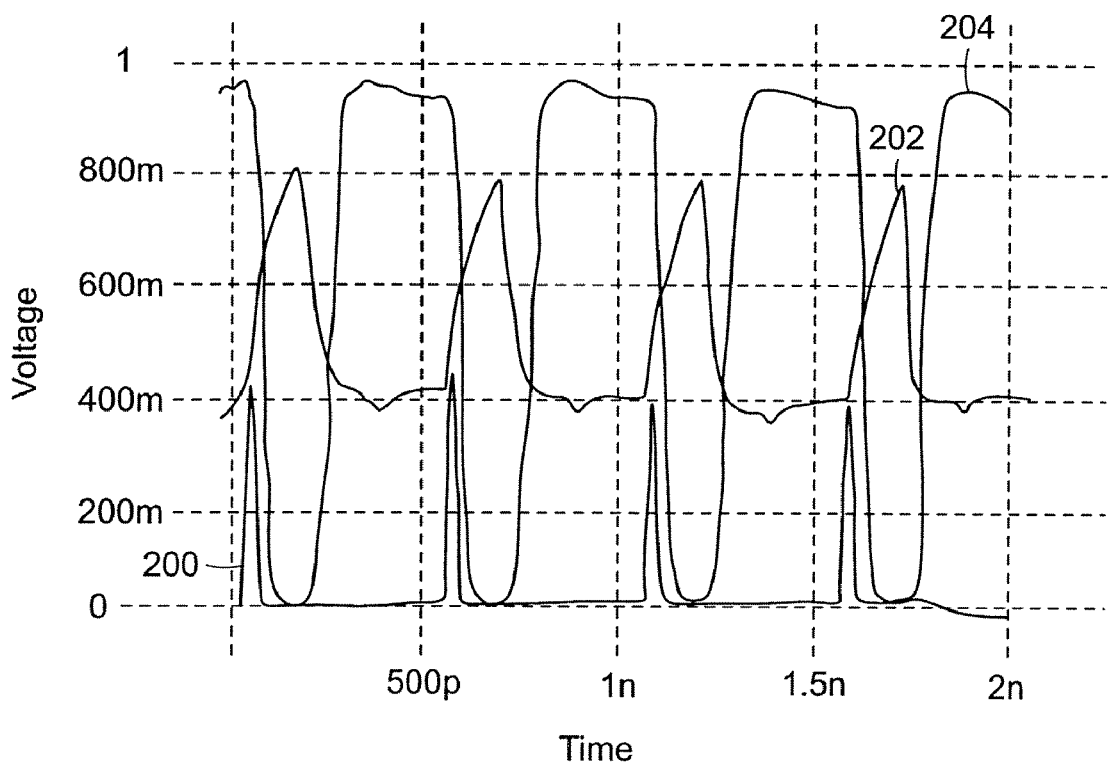
FIG. 4 shows the voltage waveforms at different nodes within the circuit depicted in FIG. 2.

The results of a simulation of the circuit are presented in FIG. 4. This is useful to further illustrating the operation of the circuit. In this particular case, the circuit was simulated in a 90-nm CMOS technology with a nominal supply of 1 V. The detector was modeled as a current source that rises to 400 uA in 5 ps, remains at that level for 10 ps, and falls to zero in 5 ps. The detector capacitance was 80 fF.

FIG. 4 shows the waveforms at different nodes. Trace 200 shows the arriving charge packet represented by a voltage that is equivalent to the input current, $I_{in}$. Trace 202 shows the voltage at point X. Notice that in response to receiving the charge packet, the voltage at point X begins to increase relatively slowly. This is amplified by output inverter 106 to produce the rail-to-rail swing at point Y.

Figure 5:
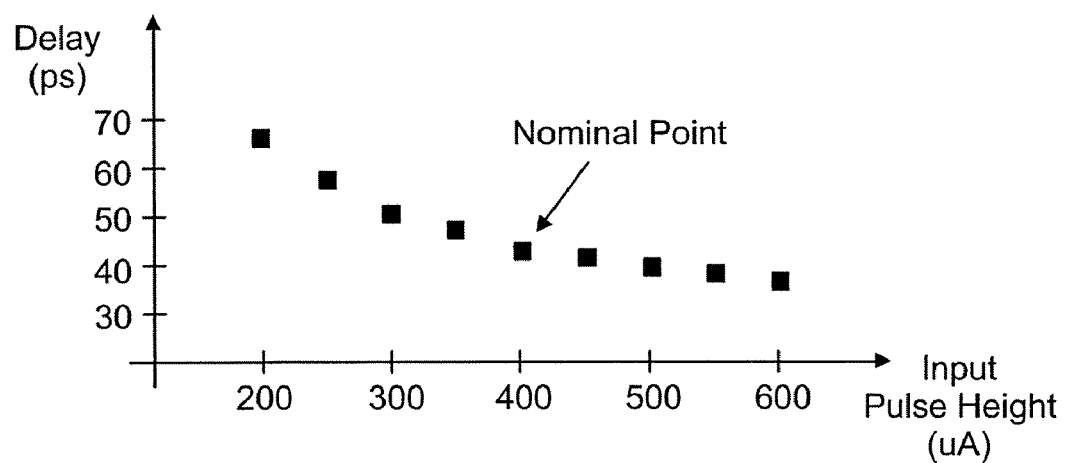
FIG. 5 shows the variation of skew with pulse height.
Figure 6:
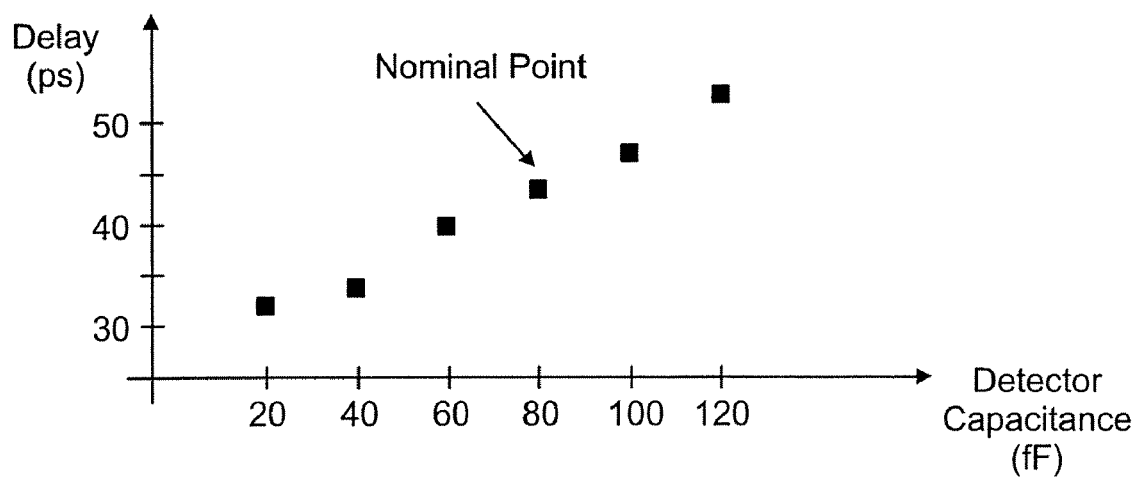
FIG. 6 shows the variation of skew with detector capacitance.

It is also observed that the skew is typically around 45 ps. FIG. 4 plots the variation of this skew with pulse height under typical process conditions and room temperature. And FIG. 5 plots the variation with the detector capacitance.

In the above description, the optical ready substrate was selected as being merely illustrative of an environment in which the self-resetting amplifier could be used. Its choice as an example is not intended to be limiting in any way.

The pulse detector can be employed in any environment in which optical pulses are detected and then converted into electrical signals for use by other circuitry. Using optical waveguides and optical detectors other than the ones illustrated herein can be employed and fall within the scope of the claims.

Those experienced in the field will realize that this circuit could also be used for data reception such as in data broadcast systems.

Still other embodiments are within the following claims.

What is claimed is:

1. A circuit comprising:
   an optical detector for detecting an optical pulse and generating therefrom a current pulse on an output; and
   a pulse detector circuit having an input electrically connected to the optical detector and having an output for outputting a detection pulse in response to receiving the current pulse on its input, said detection pulse characterized by a change in voltage, said pulse detector circuit including:
   a resettable amplifier including an input for receiving the current pulse from the optical detector, a reset terminal for resetting the amplifier after the amplifier receives the current pulse on its input, and an output for outputting a signal from which the detection pulse is derived; and a reset delay chain connected to receive the detection pulse from the output of the pulse detector circuit and to provide an electrical path over which the change in voltage that characterizes the detection pulse propagates to produce at the reset terminal of the resettable amplifier a feedback signal that is delayed relative to the detection pulse and which resets the resettable amplifier, wherein the resettable amplifier is configured to switch from a first state to a second state upon receiving the current pulse and to switch back to the first state in response to being reset by the feedback signal.

2. The circuit of claim 1, further comprising an optical waveguide, wherein the optical detector is arranged to detect the optical pulse as it travels through the optical waveguide.

3. The circuit of claim 1, wherein the pulse detector further comprises a biasing circuit and the resettable amplifier includes a current load that is biased by the biasing circuit.

4. The circuit of claim 3, wherein the biasing circuit is a supply-independent biasing circuit.

5. The circuit of claim 1, wherein the pulse detector circuit further includes an output stage which has an input for receiving the output signal of the resettable amplifier and an output for outputting the detection pulse.

6. The circuit of claim 5, wherein the output stage includes an output inverter.

7. The circuit of claim 6, wherein the output inverter has an input which is the input of the output stage and has an output which is the output of the output stage.

8. The circuit of claim 7, wherein the reset delay chain is connected between the output of the output stage and the reset terminal.

9. The circuit of claim 3, wherein the current load is a MOSFET.

10. The circuit of claim 1, wherein the resettable amplifier includes a MOSFET configured as a common-source stage.

11. The circuit of claim 3, wherein the biasing circuit includes a current mirror.

12. The circuit of claim 11, wherein the biasing circuit is a resistorless biasing circuit.

13. The circuit of claim 11, wherein the biasing circuit includes a first and second transistor configured as a first current mirror and a third and fourth transistor configured as a second current mirror.

14. The circuit of claim 13, wherein the first, second, third and fourth transistors are MOSFETs.

15. The circuit of claim 14, wherein the first and second MOSFETs have channel lengths that are equal and wherein the third and fourth MOSFETs have channel lengths that are unequal.

16. The circuit of claim 15, wherein the current load is a MOSFET and wherein the first and second MOSFETs and the current load MOSFET have their gate terminals electrically connected together.

17. The circuit of claim 1, wherein the reset delay chain is a plurality of inverters connected in series.

18. The circuit of claim 17, wherein the reset delay chain is made up of an odd number of inverters connected in series.

19. The circuit of claim 1, wherein the optical detector is directly connected to the input of the resettable amplifier.

20. A method of detecting an optical pulse traveling through an optical waveguide, said method comprising:
converting the optical pulse traveling through the optical waveguide to a current pulse;
converting the current pulse to a voltage pulse;
biasing a resettable amplifier in a first state which is in a high gain region of operation;
using the voltage pulse to cause the resettable amplifier to switch from the first state to a second state and thereby generate a detection pulse which is characterized by a voltage transition; propagating the voltage transition through a delay circuit to generate a feedback signal that is delayed relative to the detection pulse; and
using the feedback signal to reset the resettable amplifier from the second state back to the first state.

21. A circuit comprising:
an optical detector for detecting optical clock pulses and generating therefrom corresponding electrical pulses on an output; and
a pulse detector circuit having an input electrically connected to the optical detector and having an output for outputting electrical clock pulses in response to receiving the electrical pulses on its input, each of said electrical clock pulses characterized by a corresponding change in voltage, said pulse detector circuit including:
a resettable amplifier including an input for receiving the electrical pulses from the optical detector, a reset terminal for resetting the amplifier after the amplifier receives each of the electrical pulses on its input, and an output for outputting a signal from which the electrical clock pulses are derived; and
a reset delay chain connected to receive the electrical clock pulses at the output of the pulse detector circuit and to provide for each of the received electrical clock pulses an electrical path over which the change in voltage that characterizes that received electrical clock pulse propagates to produce at the reset terminal of the resettable amplifier a feedback signal that is delayed relative to that received electrical clock pulse and which resets the resettable amplifier, wherein the resettable amplifier is configured to switch from a first state to a second state upon receiving each of the electrical pulses and to switch back to the first state in response to being reset by the feedback signal.

22. A method of detecting optical clock pulses traveling through an optical waveguide, said method comprising:
converting the optical clock pulses to corresponding electrical pulses;
biasing a resettable amplifier in a first state which is in a high gain region of operation;
in response to each of the electrical pulses, (1) causing the resettable amplifier to switch from the first state to a second state and thereby generate a detection pulse which is characterized by a voltage transition, (2) propagating the voltage transition through a delay circuit to generate a feedback signal, and (3) using the feedback signal to reset the resettable amplifier from the second state back to the first state.

23. The circuit of claim 1, further comprising a biasing circuit that biases the resettable amplifier in a high gain region during operation, said first state being in the high gain region.

24. The circuit of claim 21, further comprising a biasing circuit that biases the resettable amplifier in a high gain region during operation, said first state being in the high gain region.

* * * * *